(12) United States Patent
Rogenmoser et al.

(10) Patent No.: US 6,671,216 B2
(45) Date of Patent: *Dec. 30, 2003

(54) METHOD AND APPARATUS TO CONDITIONALLY PRECHARGE A PARTITIONED READ-ONLY MEMORY WITH SHARED WORDLINES FOR LOW POWER OPERATION

(75) Inventors: Robert Rogenmoser, Santa Clara, CA (US); Steve T. Nishimoto, Redwood City, CA (US); Daniel W. Dobberpuhl, Menlo Park, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/349,121

(22) Filed: Jan. 22, 2003

(65) Prior Publication Data

US 2003/0107933 A1 Jun. 12, 2003

Related U.S. Application Data

(63) Continuation of application No. 10/173,087, filed on Jun. 17, 2002, now Pat. No. 6,538,943, which is a continuation of application No. 09/854,365, filed on May 11, 2001, now Pat. No. 6,430,099.

(51) Int. Cl.⁷ .............................................. G11C 7/00
(52) U.S. Cl. ...................... 365/203; 365/230.03; 365/94
(58) Field of Search ........................... 365/203, 230.03, 365/94, 204, 185.11

(56) References Cited

U.S. PATENT DOCUMENTS

| 4,602,354 A | 7/1986 | Craycraft et al. ............ 365/203 |
| 4,817,057 A | 3/1989 | Kondo et al. ................ 365/203 |
| 4,969,125 A | 11/1990 | Ciraula et al. .............. 365/203 |
| 5,036,494 A | 7/1991 | Wise et al. .................. 365/203 |
| 5,291,453 A | 3/1994 | Aota et al. ................... 365/203 |
| 5,594,700 A | 1/1997 | Ward et al. ............. 365/189.05 |
| 5,717,637 A | 2/1998 | Hotta ..................... 365/189.05 |
| 5,787,489 A | 7/1998 | Pawlowski ............. 365/189.05 |
| 5,822,264 A | 10/1998 | Tomishita et al. ...... 365/230.03 |
| 5,862,090 A | 1/1999 | Numata et al. ............. 365/203 |
| 5,923,594 A | 7/1999 | Voshell .................. 365/189.05 |
| 5,949,731 A | 9/1999 | Tsukude ................ 365/230.03 |
| 6,064,605 A | 5/2000 | Muranaka et al. ..... 365/189.08 |
| 6,104,666 A | 8/2000 | Kumar ................... 365/230.06 |
| 6,181,641 B1 | 1/2001 | Lee et al. ................ 365/233.5 |
| 6,185,137 B1 | 2/2001 | Sato et al. .................. 365/200 |
| 6,195,286 B1 | 2/2001 | Pascucci ................ 365/185.12 |
| 6,430,099 B1 * | 8/2002 | Rogenmoser et al. ....... 365/203 |
| 6,538,943 B2 | 3/2003 | Rogenmoser et al. ....... 365/203 |

OTHER PUBLICATIONS

SiByte, "Target Applications," http://sibyte.com/mercurian/applications.htm, Jan. 15, 2001, 2 pages.

(List continued on next page.)

Primary Examiner—Tan T. Nguyen
(74) Attorney, Agent, or Firm—Lawrence J. Merkel (57) ABSTRACT

A ROM or other memory may include two or more partitions and a precharge circuit. Each of the partitions may be coupled to separate sets of output conductors, to which the precharge circuit may be coupled. The precharge circuit may precharge the conductors of the partition to be read, while not precharging the other conductors. In one embodiment, the precharge may be to a voltage representing a binary value. In one implementation, the non-precharged conductors may be held to a predetermined voltage different from the voltage to which the precharged conductors are precharged. The predetermined voltage may represent the opposite binary value to the binary value represented by the precharge voltage. The ROM may also include an output circuit which may, in certain embodiments, comprise a logic circuit which logically combines the signals on respective conductors from each partition to provide output signals from the ROM.

22 Claims, 6 Drawing Sheets

OTHER PUBLICATIONS

SiByte, "SiByte Technology," http://sibyte.com/mercurian/technology.htm, Jan. 15, 2001, 3 pages.

SiByte, "The Mercurian Processor," http://sibyte.com/mercurian, Jan. 15, 2001, 2 pages.

SiByte, "Fact Sheet," SB–1 CPU, Oct. 2000, rev. 0.1, 1 page.

SiByte, "Fact Sheet," SB–1250, Oct. 2000, rev. 0.2, 10 pages.

Stepanian, SiByte, Sibyte SB–1 MIPS64 CPU Core, Embedded Processor Forum 2000, Jun. 13, 2000. 15 pages.

Jim Keller, "The Mercurian Processor: A High Performance, Power–Efficient CMP for Networking," Oct. 10, 2000, 22 pages.

Tom R. Halfhill, "SiByte Reveals 64–Bit Core For NPUs; Independent MIPS64 Design Combines Low Power, High Performance," Microdesign Resources, Jun. 2000, Microprocessor Report, 4 pages.

SiByte, "Target Applications," http://sibyte.com/mercurian/applications.htm, Jan. 15, 2001, 2 pages.

* cited by examiner

METHOD AND APPARATUS TO CONDITIONALLY PRECHARGE A PARTITIONED READ-ONLY MEMORY WITH SHARED WORDLINES FOR LOW POWER OPERATION

This application is a continuation of U.S. patent application Ser. No. 10/173,087,filed Jun. 17, 2002, now U.S. Pat. No. 6,538,943, which is a continuation of U.S. patent application Ser. No. 09/854,365, filed May 11, 2001 now U.S. Pat. No. 6,430,099.

BACKGROUND OF THE INVENTION

1. Field of the Invention

This invention is related to semiconductor memories and, more particularly, to precharging in read-only memories.

2. Description of the Related Art

Read-only memories (ROMs) are a basic building block in integrated circuit design. As the name implies, ROMs are memories which can be read but not written. They are useful for storing a variety of constants which may be needed during operation of the integrated circuits, and may also store instructions for execution in a processor. For example, microcode used to execute complex instructions may be stored in a ROM. Additionally, in processors such as digital signal processors (DSPs), microcontrollers, and embedded processors, the program code to be executed may be stored in an ROM. The ROMs may be either integrated into the integrated circuit using the ROM contents or may be a separate chip coupled to the integrated circuit.

Generally, ROMs are arranged as a plurality of locations, each containing one or more bits. Each location is addressable in the ROM using a different address. Each location may include a transistor for each bit, either coupled or not coupled to a bitline used to output that bit. The bitline is precharged prior to activating the transistor. When the transistor is activated, if it is coupled to the bitline, the precharge is dissipated and one value (binary one or zero) for the bit is provided as the output. If the transistor is not coupled to the bitline, the precharge is not dissipated and the other value (binary zero or one) is provided as the output.

Some ROMs may be partitioned, in which the memory is divided into two or more partitions. One location in each partition may be mapped to a particular address presented to an address decoder in the ROM. However, only one of the partitions may output a value in response to a given read of the ROM.

For partitioned ROMs, precharging all of the partitions may lead to unnecessary power dissipation since the output of only one of the partitions is actually going to be selected as an output of the ROM for a given read.

SUMMARY OF THE INVENTION

A ROM described herein may include two or more partitions and a precharge circuit. Each of the partitions may be coupled to separate sets of output conductors, to which the precharge circuit may be coupled. The precharge circuit may precharge the conductors of the partition to be read, while not precharging the other conductors. The power dissipated precharging the partitions not to be read may be saved. In one embodiment, the precharge may be to a voltage representing a binary value. In one implementation, the non-precharged conductors may be held to a predetermined voltage different from the voltage to which the precharged conductors are precharged. The predetermined voltage may represent the opposite binary value to the binary value represented by the precharge voltage.

The ROM may also include an output circuit which may, in certain embodiments, comprise a logic circuit which logically combines the signals on respective conductors from each partition to provide output signals from the ROM. The output circuit may not require a selection control in such embodiments. While a ROM is used in certain embodiments, other embodiments may be any type of memory, as desired.

Broadly speaking, an apparatus is contemplated, comprising a first partition of a memory array, a second partition of the memory array, and a precharge circuit. The first partition is configured to output at least a first signal on a first conductor, and the second partition is configured to output at least a second signal on a second conductor. Coupled to the first conductor and the second conductor, the precharge circuit is configured to precharge the first conductor to a voltage representing a binary value responsive to an input indicating that the first partition is selected for a read. Additionally, the precharge circuit is configured to not precharge the second conductor responsive to the input.

Additionally, a method is contemplated. A first partition of a memory array is selected for a read. A first conductor is precharged to a voltage representing a binary value responsive to selecting the first partition, wherein the first conductor corresponds to the first partition. Additionally, a second conductor corresponding to a second partition of the memory array is not precharged responsive to selecting the first partition.

BRIEF DESCRIPTION OF THE DRAWINGS

The following detailed description makes reference to the accompanying drawings, which are now briefly described.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Figure 1:
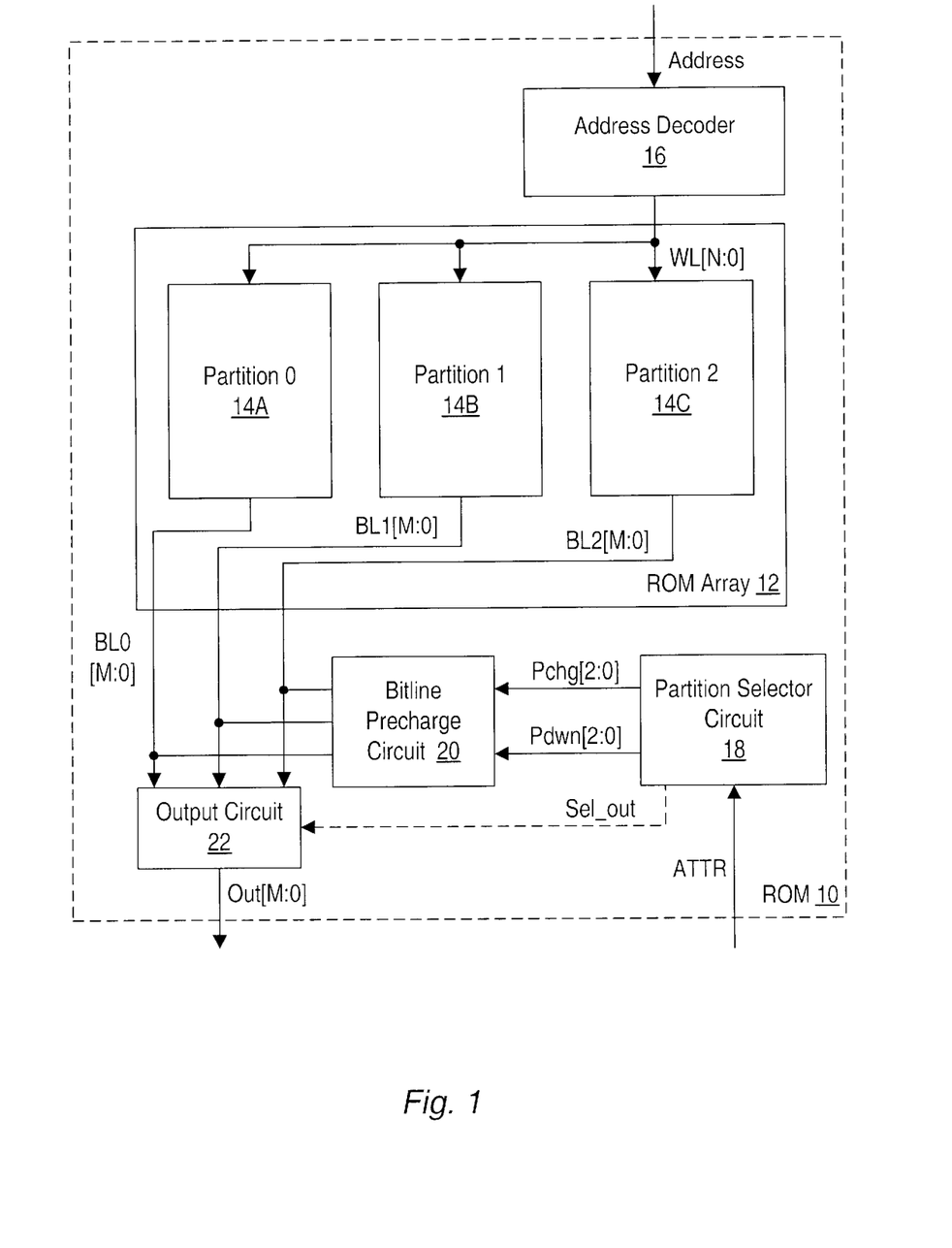
FIG. 1 is a block diagram of one embodiment of a read-only memory (ROM).

Turning, now to FIG. 1, a block diagram of one embodiment of a read-only memory (ROM) 10 is shown. Other embodiments are possible and contemplated. In the embodiment of FIG. 1, the ROM 10 includes a ROM array 12 including a first partition (Partition 0) 14A, a second partition (Partition 1) 14B, and a third partition (Partition 2) 14C.

Additionally, the illustrated embodiment includes an address decoder 16, a partition selector circuit 18, a bitline precharge circuit 20, and an output circuit 22. The address decoder 16 is coupled to receive an address input to the ROM 10 and generates N wordline signals (WL[N:0] in FIG. 1) on a set of wordline conductors to which each of the partitions 14A–14C are coupled. The partitions are each coupled to separate sets of bitline conductors on which the partitions output M bitline signals (BL0[M:0] for the first partition 14A. BL1[M:0] for the second partition 14B, and BL2[M:0] for the third partition 14C in FIG. 1). Both the bitline precharge circuit 20 and the output circuit 22 are coupled to each of the bitline conductors from the partitions 14A–14C. The output circuit 22 is coupled to provide the output of the ROM 10 (Out[M:0] in FIG. 1) and may optionally receive a selection control (Sel_out in FIG. 1) from the partition selector circuit 18. The bitline precharge circuit 20 is coupled to receive a precharge input (Pchg[2:0] in FIG. 1) and a pull down input (Pdwn[2:0] in FIG. 1) from the partition selector circuit 18. The partition selector circuit 18 is further coupled to receive an attribute input (ATTR in FIG. 1) to the ROM 10.

Generally, the bitline precharge circuit 20 is configured to precharge one of the sets of bitline conductors corresponding, to one of the partitions of the ROM array 12 in response to that partition being selected for a read of the ROM 10. Furthermore, the bitline precharge circuit 20 is configured to not precharge other ones of the sets of conductors corresponding to the remaining partitions. Power dissipation in the ROM 10 may be reduced due to the lack of precharge of the partitions which are not being read (and thus reducing subsequent possible dissipation of the precharge in response to the activation of a wordline to those partitions).

Additionally, in the illustrated embodiment, the bitline precharge circuit 20 is configured to hold non-precharged conductors at a predetermined voltage different from a precharge voltage to which the precharged conductors are precharged. Particularly, the predetermined voltage may be the voltage produced on the conductor if a transistor within the corresponding partition 14A–14C is activated by a wordline signal provided from the address decoder 16. In such an embodiment, power dissipation may be further reduced by reducing the leakage current which may occur in the precharge devices coupled to those conductors even though the precharge devices may not be actively precharging the conductors.

In the illustrated embodiment, the partition selector circuit 18 provides the Pchg[2:0] input signals to control which of the sets of conductors are precharged and which are not. Particularly, the Pchg[2:0] signals may include a separate signal for each partition, indicating whether or not that partition is selected for reading. Alternatively, an encoded value may be used. If the partition is not selected, the corresponding bitline conductors are not precharged. If the partition is selected, the corresponding bitline conductors are precharged.

The partition selector circuit 18 may also supply the Pdwn[2:0] signals to control which bitline conductors are held to the predetermined voltage. Particularly, the Pdwn[2:0] signals may include a separate signal for each partition, indicating whether or not that partition is selected for reading. Alternatively, an encoded value may be used. The set of Pdwn[2:0] signals separate from the Pchg[2:0] signals may be used in the illustrated embodiment because the Pdwn[2:0] signals may be active during a different time period than the Pchg[2:0] signals (either overlapping or non-overlapping). In other embodiments in which the time periods are the same, a single set of signals may accomplish both the selective precharge of conductors corresponding to one partition and the holding of the voltage on the other conductors may be used. Furthermore, a single encoded value could be provided which is used to cause the precharge and the holding of the voltage.

In some embodiments (e.g. FIGS. 2–4 below), the precharge voltage may be the power supply voltage supplying the ROM 10 and/or the integrated circuit including the ROM 10 (illustrated as $V_{dd}$ in FIGS. 2–4) and the predetermined voltage used for the non-precharged conductors may be ground. Other embodiments could employ the precharge voltage as ground and the predetermined voltage as $V_{dd}$. Generally, the bitline precharge circuit 20 may precharge conductors to a voltage representing one of the binary values each bit may take on (binary zero or binary one). If a transistor within the corresponding partition coupled to the conductor is activated, the transistor dissipates the precharge and thus the conductor carries a voltage indicating the other binary value (binary one or binary zero). Additionally, the predetermined voltage to which the conductors for the non-selected partitions is held may also represent one of the binary values (the opposite value to that represented by the precharge voltage).

A read of the ROM 10 will now be described in more detail. Generally, an address of the location to be read is provided as an input to the ROM 10 (particularly, the address decoder 16), and one or more other attributes of the read are provided to the partition selector circuit 18. Various attributes for various exemplary embodiments are described in more detail below. Prior to initiating the read from the partitions 14A–14C, the bitline precharge circuit 20 precharges the bitline conductors corresponding to the partition being read (as indicated by the other attributes received by the partition selector circuit 18). Additionally, the bitline precharge circuit 20 holds the conductors corresponding to the partitions not being read to the predetermined voltage.

After the precharge, the bitline precharge circuit 20 deactivates the precharge circuits therein and the partition being read may evaluate to determine the value output from the ROM 10. The address decoder 16 decodes the address to generate the wordline signals. Particularly, one of the wordline signals WL[N:0] is activated to select the addressed location in each partition 14A–14C and the other wordline signals WL[N:0] are inactive. The wordline signals may be active high or active low (e.g. active high for the embodiments shown in FIGS. 2–4). Generally, a wordline signal is provided for each location within a given partition. The transistors coupled to the active wordline signal activate and may dissipate the precharge on one or more of the bitline conductors to generate the value corresponding to that location. The output circuit 22 then outputs the value as Out[M:0]. Various embodiments of the output circuit are illustrated below in FIGS. 2–4. Depending on the embodiment or the output circuit 22 the optional Sel_out signal may be used to select the output from one of the partitions 14A–14C.

The partition selector circuit 18 may generate the Pchg[2:0] signals responsive to the ATTR input. Generally, the ATTR input may be any attribute of the read being performed. For example, the ATTR input may be additional address bits separate from the address provided to the address decoder 16. In other embodiments, the ATTR input may be an attribute other than the address of the read. For example, in one implementation, the ROM 10 may store constants used in various floating point operations.

Specifically, an embodiment may include constants used if a square root of an odd operand is being computed in one partition (e.g. partition 14A), constants used if a square root of an even operand is being computed in another partition (e.g. partition 14B), and constants used if a reciprocal is being computed (e.g. partition 14C). Other embodiments may include additional partitions to store constants for other floating point functions (e.g. other transcendental functions such as sine, cosine, etc.), and other embodiments may not include the square root and/or reciprocal functions. In such implementations, the type of instruction being processed and the least significant bit of the operand (for square root) may be attributes of the read which are used to select the partition. Another implementation in which the ROM 10 is storing microcode instructions is contemplated. The type of instruction being processed via the microcode could be an attribute of the read used to select the partition (e.g. different partitions could be used for integer, floating point, etc. or different classes of instructions). Alternatively, one partition could be used for microcode routines corresponding to instructions and another partition for exception handling code, and thus whether or not an exception is being handled could be the attribute of the read used to select a partition. Generally, an attribute of a read may be any information corresponding to the read.

Generally, each of the bitline signals BL0[M:0], BL1[M:0], and BL2[M:0] represents a bit of the value being read from the corresponding partition. In other words, the voltage of the corresponding signal is defined as either a binary one or a binary zero. In complementary metal-oxide-semiconductor (CMOS) circuitry, the $V_{dd}$ voltage is defined as a binary one and the around voltage is defined as a binary zero. Thus, each partition outputs an M bit value from an addressed location. In various implementations, M may be any integer treater than or equal to zero. If M is zero, each partition outputs a single bit for a given read. If M is one, two bits are output, etc. Similarly, the N wordline signals may be any integer greater than or equal to one in various embodiments (i.e. various embodiments may include two or more locations in a partition). If desired, various partitions may have differing numbers of locations. In such an embodiment, N may be the largest number of locations in any one of the partitions. Furthermore, other embodiments may employ column selection within a partition, in which multiple locations in a partition are selected via activation of a given wordline signal and a column select circuit selects one of the locations (e.g. by decoding address bits or other attributes). In such embodiments, bitline conductors at either the input or the output of the column select circuit may be precharged in the partition being read.

It is noted that, while the above description applies the conditional precharge of the conductors corresponding to a selected partition in a ROM, other memories may employ a similar technique. For example, programmable ROMs (PROMs) may employ the technique (e.g. erasable PROMs (EPROMS) or electrically erasable PROMs (EEPROMS)). Furthermore, flash memory may also employ the technique, etc.

It is noted that, while three partitions are shown in FIGS. 1–4, other embodiments may employ two or more partitions, as desired. Furthermore, while the above description refers to both precharging the set of bitline conductors corresponding to the partition being read and holding the voltage of the bitline conductors corresponding to the remaining partitions, other embodiments may only perform the selective precharge of the bitline conductors corresponding to the partition being read and not precharging the remaining bitline conductors.

While the partition selector circuit 18 is included in the embodiment of FIG. 1, other embodiments may eliminate the partition selector circuit 18, may integrate its function into the bitline precharge circuit 20, or may provide decoded control inputs to the bitline precharge circuit 20 in response to the one or more attributes used to select a partition. As used herein, the term partition refers to a portion of a memory from which a value may be output. The memory may have multiple independent partitions, one of which may provide an output from the memory at any given time.

Figure 2:
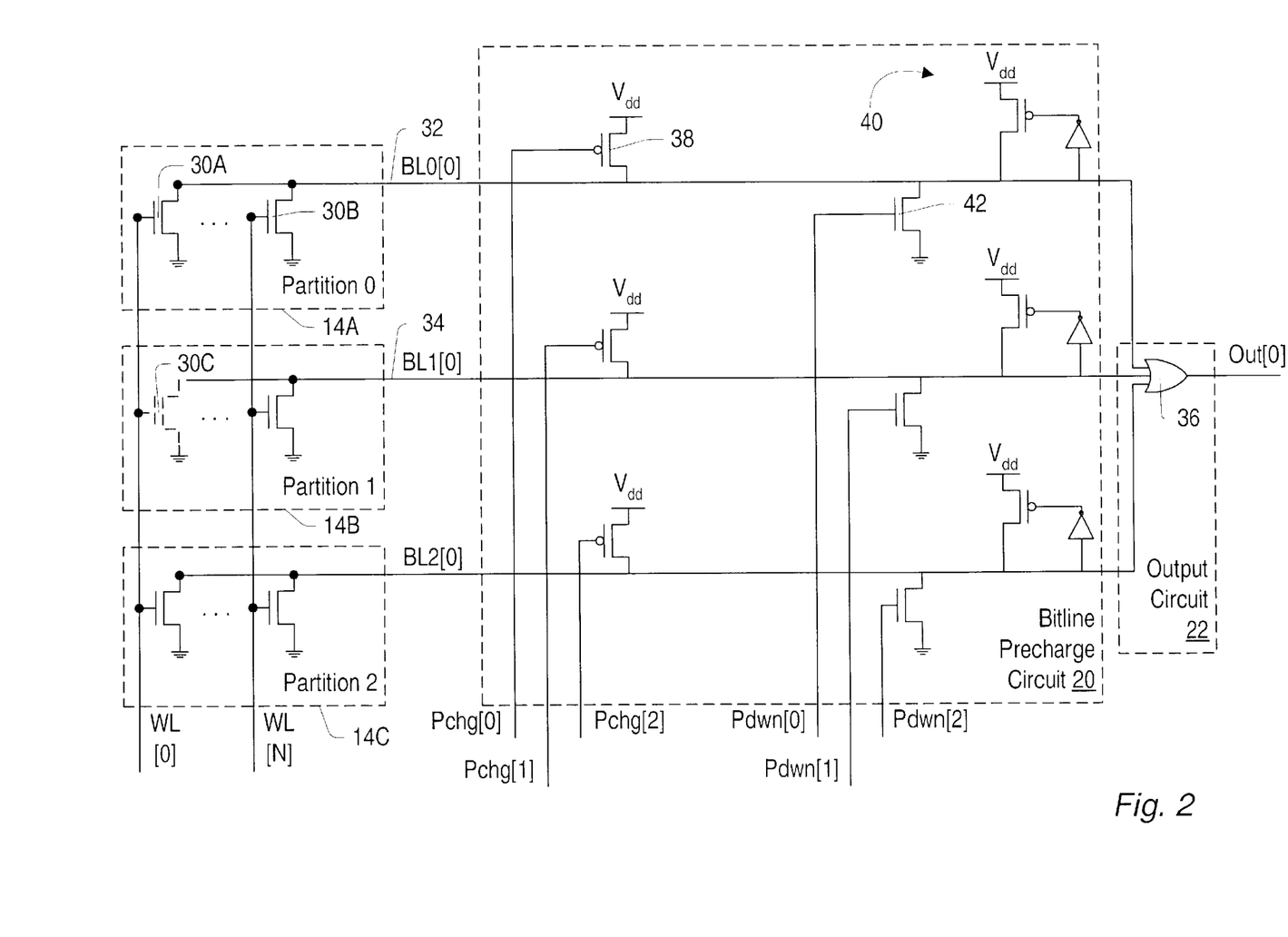
FIG. 2 is a circuit diagram of a portion of one embodiment of the ROM shown in FIG. 1.

Turning now to FIG. 2, a circuit diagram of a portion of one embodiment of the ROM 10 is shown. Other embodiments are possible and contemplated. In the embodiment of FIG. 2, the portion of the ROM array 12, the bitline precharge circuit 20, and the output circuit 22 corresponding to output bit 0 (Out[0]) is shown. Similar circuitry may be included for each other output bit.

As illustrated in FIG. 2, the partition 14A may include a transistor coupled to receive each wordline signal (WL[N:0]) and either coupled or not coupled to the bitline conductor corresponding to BL0[0] (reference numeral 32). For example, transistor 30A is shown coupled to receive the wordline signal WL[0] and coupled to the bitline conductor 32. Similarly, transistor 30B is shown coupled to receive the wordline signal WL[N] and coupled to the bitline conductor 32. Other transistors, not shown, may be coupled to receive other wordline signals WL[N-1:1]. Specifically, the transistors 30A–30B are N-type MOS (NMOS) transistors which receive the respective wordline signals on the gate terminals thereof. Thus, in response to an active wordline signal, the corresponding transistor may discharge the conductor 32 to ground.

The partition 14A includes transistors 30A–30B coupled to the conductor 32. However, a transistor may not be coupled to the corresponding bitline conductor. For example, a transistor 30C is illustrated in the partition 14B coupled to receive the wordline signal WL[0] but not coupled to the bitline conductor corresponding to BL1[0] (reference numeral 34). Thus, if the wordline WL[0] is active, the value output for bit 0 of the ROM 10 may be one binary value if partition 14A is selected for the read and the opposite binary value if partition 14B is selected for the read. In the illustrated embodiment, transistor 30A discharges the conductor 32 which feeds an OR gate 36 in the output circuit 22, and thus partition 14A outputs a binary zero. However, since transistor 30C is not coupled to the conductor 34, the conductor 34 remains precharged (if partition 14B was selected for reading and the precharge was performed in response thereto) and thus a binary one is output by the output circuit 22. It is noted that, since transistor 30C is not coupled to the conductor 34, transistor 30C may be eliminated if desired. Thus, transistor 30C is illustrated in dashed form in FIG. 2. Alternatively, the transistor 30C may be included but not coupled to the conductor 34. As transistors 30A and 30C illustrate, the binary value output from the ROM 10 may depend on whether or not the corresponding transistor is coupled to the bitline conductor.

The operation of the circuitry within bitline precharge circuit 20 will be described with respect to partition 14A and conductor 32. Similar operation may occur for the circuitry corresponding to partitions 14B–14C as illustrated in FIG. 2. With respect to conductor 32, the bitline precharge circuit 20 includes a PMOS transistor 38 and a keeper circuit 40. The transistor 38 is coupled between the power supply $V_{dd}$ and the conductor 32 and has a gate terminal coupled to receive the Pchg[0] signal. Thus, if the partition 14A is selected for reading, the partition select circuit may activate the Pchg[0] signal (active low in this embodiment), which activates the transistor 38. The transistor 38 precharges the conductor 32 to the $V_{dd}$ voltage. As the voltage on conductor 32 rises, the inverter within the keeper circuit 40 switches its output (and thus the gate terminal of the PMOS transistor in the keeper circuit 40) to a low (ground) voltage. The transistor in the keeper circuit 40 activates, serving to retain the precharged voltage on the conductor 32. The precharge portion of the read may end, and the Pchg[0] signal may be deactivated (thus deactivating the transistor 38). However, the keeper circuit 40 may retain the precharged voltage unless one of the transistors 30A–30B activates and discharges the conductor 32. More particularly, the transistors 30A–30B may be capable of "overdriving" the PMOS transistor within the keeper circuit 40, thus discharging the conductor 32.

Figure 3:
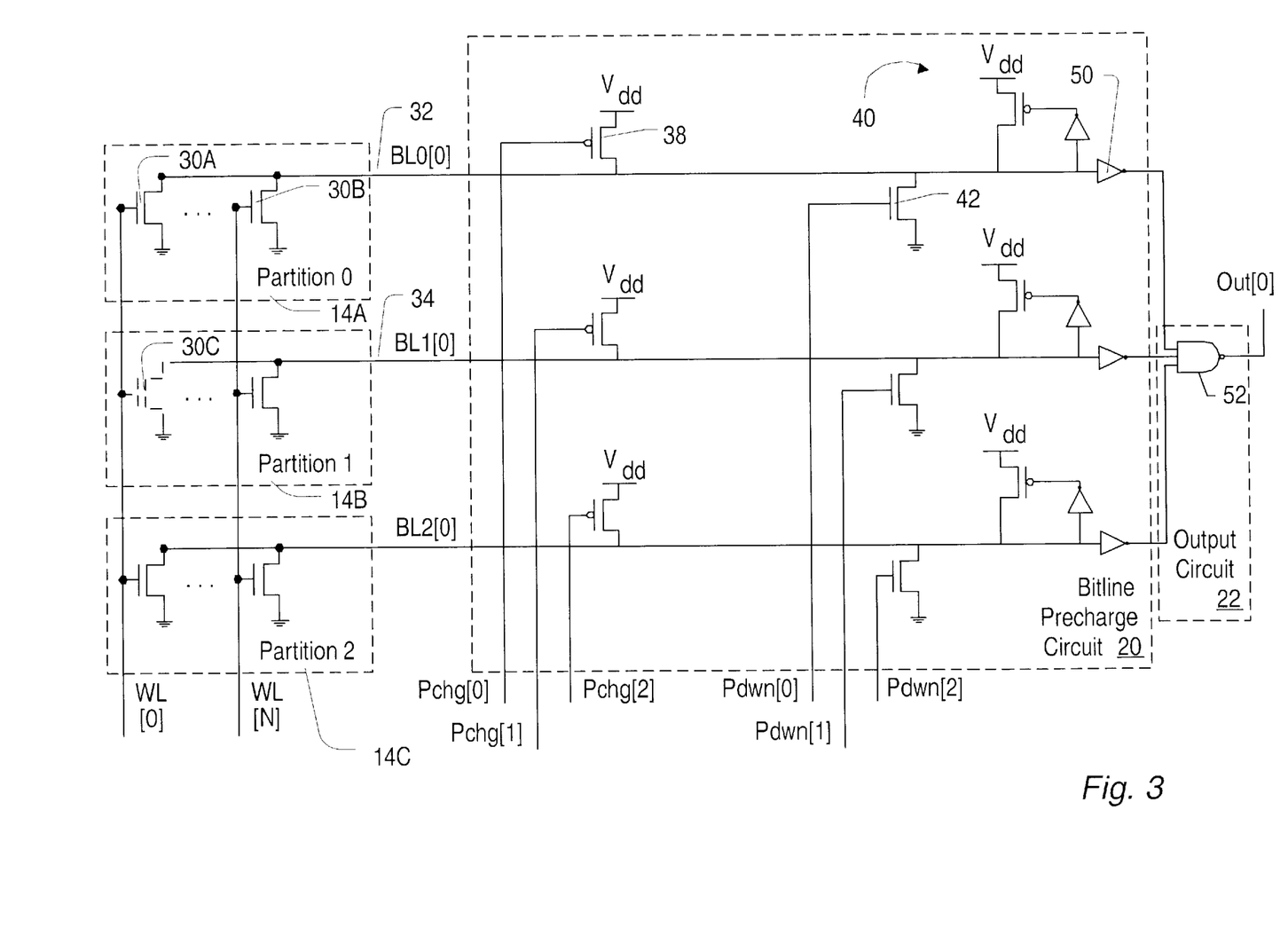
FIG. 3 is a circuit diagram of a portion of a second embodiment of the ROM shown in FIG. 1.

Additionally, an NMOS transistor 42 is shown coupled between the conductor 32 and ground and having a gate terminal coupled to receive the Pdwn[0] signal. If partition 14A is not selected for reading, the Pdwn[0] signal may be activated (active high in this embodiment), thus activating the transistor 42. The transistor 42 may hold the conductor 42 at a aground voltage when active. In the embodiment of FIGS. 2 and 3, the transistor 42 ensures that a logical value is presented to the output circuit 22 from the non-read partitions that allows the binary value from the partition being read to pass through to the output line Out[0]. For example, transistor 42 ensures that a binary zero is presented to the output circuit 22 in FIG. 2 and that a binary one is presented to the output circuit 22 in FIG. 3.

The conductor 32 is at a round voltage (binary zero) if partition 14A is not being read, and is precharged to the Vdd voltage (binary one) if partition 14A is being read (and possibly discharged to the ground voltage if the location selected by the active wordline signal includes a transistor coupled to the conductor 32). Similar operation is provided for the BL1[0] signal and the BL2[0] signal. Accordingly, the BL[0] signal may be ORed in OR gate 36 with the corresponding signals BL1[0] and BL2[0] from partitions 14B–14C. Each of the signals from the non-read partitions is a binary zero, and thus the OR of the BL1[0], BL1[0], and BL2[0] signals is equal to the value of the bit from the partition being read. The output circuit 22 does not require a selection control in this embodiment.

Since the output circuit 22 logically ORs the corresponding bitline signals from the partitions 14A–14C to produce an output bit, the connection of a transistor within a partition to the corresponding bit line conductor is made if the bit in that location is a binary zero, and the connection is not made if the bit is a binary one. Thus, for example, bit 0 of the location corresponding to wordline WL[0] in the partition 14A is a binary zero, but bit 0 of the location corresponding to wordline WL[0] in the partition 14B is binary one. On the other hand, a NOR gate could be used instead or OR gate 36. In such an embodiment, bit 0 of the location corresponding to wordline WL[0] in the partition 14A is a binary one, but bit 0 of the location corresponding to wordline WL[0] in the partition 14B is binary zero. Thus, the output circuit 22 for the embodiment of FIG. 2 may perform an OR function on the corresponding bitline signals from each partition to provide the output. An OR function may include both OR and NOR logical operations.

It is noted that, in one implementation, the channel length of the transistor 42 (and similar transistors for the other bit lines) may be approximately twice that of the channel length of the other transistors included in the ROM 10.

It is noted that the keeper circuit 40 may be optional and may be eliminated in some embodiments if noise and leakage currents can be controlled sufficiently to ensure to that the precharge voltage does not chance enough to chance the output of the ROM 10 if a transistor 30A–30B does not discharge the conductor 32.

FIG. 3 is a circuit diagram of a portion of a second embodiment of the ROM 10. Other embodiments are possible and contemplated. In the embodiment of FIG. 3, similar to FIG. 2, the portion of the ROM array 12, the bitline precharge circuit 20, and the output circuit 22 corresponding to output bit 0 (Out[0]) is shown. Similar circuitry may be included for each other output bit.

The transistors within the partitions 14A–14C, the transistor 38 (and similar transistors for other bitline conductors), the keeper circuit 40 (and similar circuits for other bitline conductors), and the transistor 42 (and similar transistors for other bitline conductors) may generally operate in the same fashion as the embodiment of FIG. 2. However, in this case, inverters are inserted between the bitline conductors and the output circuit 22. For example, an inverter 50 is inserted between the conductor 32 and the output circuit 22. The inverters may be part of the output circuit 22 or the bitline precharge circuit 20.

Since the non-precharged value (binary zero) is inverted (to a binary one), the output circuit 22 may include a NAND gate 52 coupled to receive the inverted versions of the BL0[0], BL1[0], and BL2[0] signals. The signals corresponding to partitions not being read provide binary one inputs to the NAND gate 52, thus allowing the value of the bitline signal from the partition being read to determine the output of the NAND gate 52. Thus, in the embodiment shown, a binary zero bit may be provided from a location by connecting the corresponding transistor in the partition to the bitline conductor and a binary one bit may be provided by not connecting the corresponding transistor. Alternatively, an AND gate could be used (in which case a binary one bit may be provided from a location by connecting the corresponding transistor in the partition to the bitline conductor and a binary zero bit may be provided by not connecting the corresponding transistor). Generally, the output circuit 22 for the embodiment of FIGS. 3 may perform an AND function on the corresponding bitline signals from each partition to provide the output. An AND function may include both AND and NAND logical operations.

As FIGS. 2 and 3 illustrate, any suitable logic circuit may be used within the output circuit 22. A logic circuit is any circuit which performs a logical function on one or more input signals to produce one or more output signals.

Figure 4:
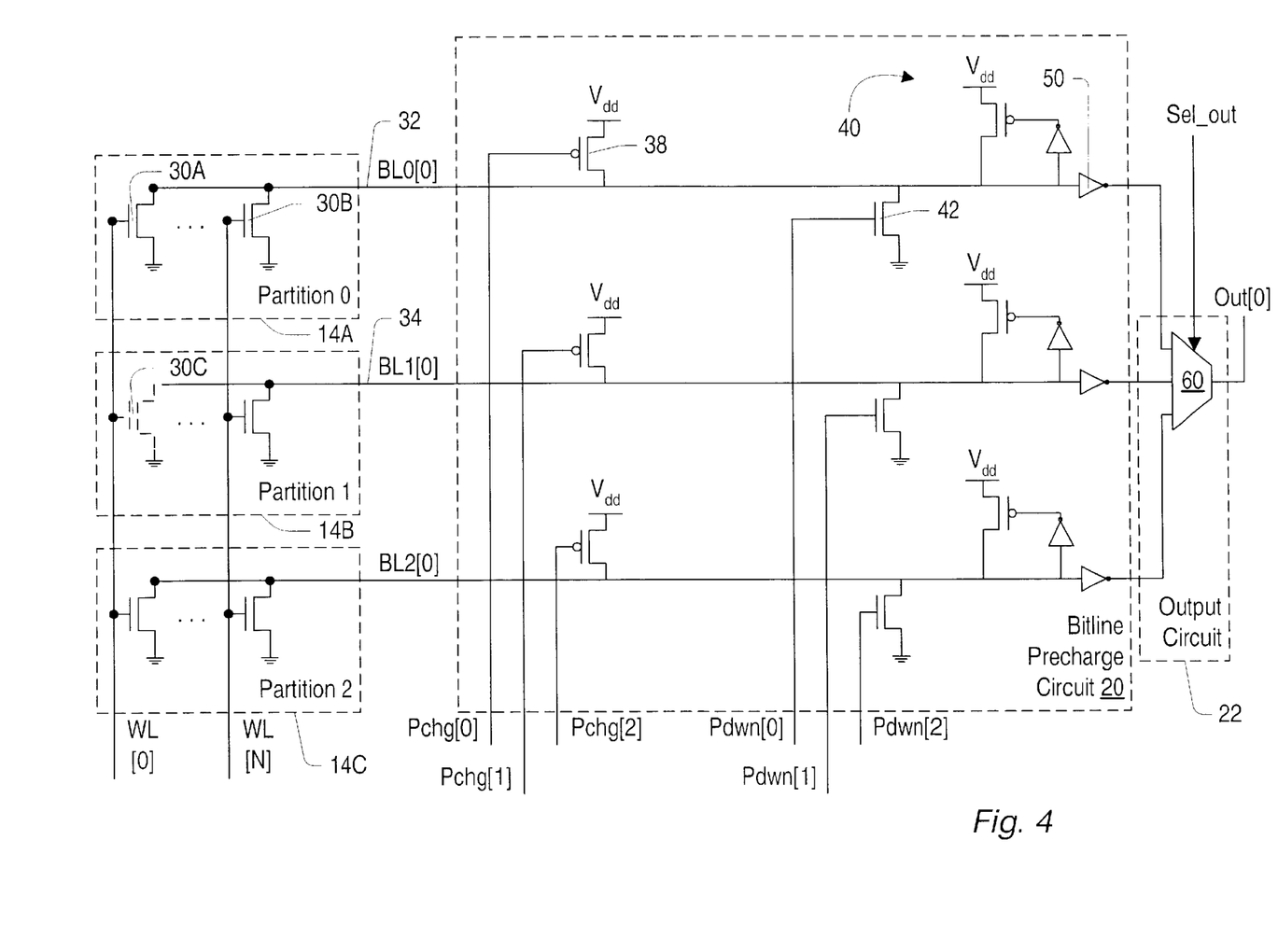
FIG. 4 is a circuit diagram of a portion of a third embodiment of the ROM shown in FIG. 1.

FIG. 4 is a circuit diagram of a portion of a third embodiment of the ROM 10. Other embodiments are possible and contemplated. In the embodiment of FIG. 4, similar to FIG. 2 the portion of the ROM array 12, the bitline precharge circuit 20, and the output circuit 22 corresponding to output bit 0 is shown. Similar circuitry may be included for each other output bit.

The transistors within the partitions 14A–14C, the transistor 38 (and similar transistors for other bitline conductors), the keeper circuit 40 (and similar circuits for other bitline conductors), the transistor 42 (and similar transistors for other bitline conductors), and the inverter 50 (and similar inverters for other bitline conductors) may generally operate in the same fashion as the embodiment of FIG. 3. However, in this case, the output circuit 22 may comprise a multiplexor (mux) 60 coupled to receive inverted versions of each of the bitline signals BL0[0], BL1[0], and BL2[0] and to select one of the signals for output in response to the selection control (Sel_out). The selection control is generated by the partition selector circuit 18 responsive to the selected partition.

In the illustrated embodiment, a binary one bit may be provided from a location by connecting the corresponding transistor in the partition to the bitline conductor and a binary zero bit may be provided by not connecting the corresponding transistor. Alternatively, an embodiment in which the inverter 50 and similar inverters are eliminated is contemplated (and a binary zero bit may be provided from a location by connecting the corresponding transistor in the partition to the bitline conductor and a binary one bit may be provided by not connecting the corresponding transistor).

In one embodiment similar to FIG. 4, the transistor 42 (and similar transistors for other bit lines) may be deleted.

Figure 5:
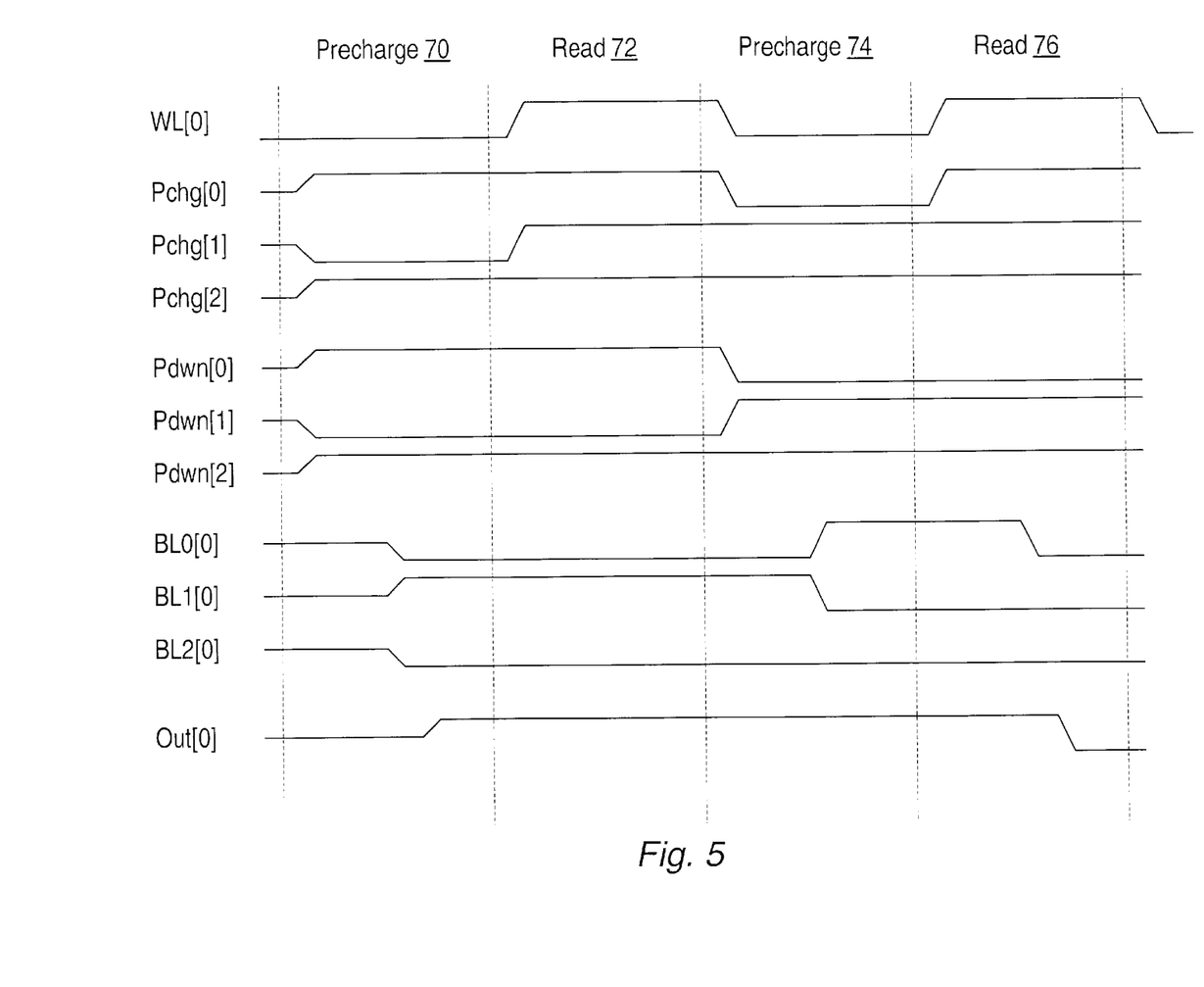
FIG. 5 is a timing diagram illustrating operation of the embodiment of the ROM shown in FIG. 2.

Turning now to FIG. 5, a timing diagram is shown illustrating exemplary operation of the embodiment shown in FIG. 2. Particularly, two reads of the location corresponding to wordline signal WL[0] are shown. In FIG. 5, vertical dashed lines delimit precharge and read phases. Each phase is labeled at the top of FIG. 5. Each phase may be a portion of a clock cycle (e.g. one clock phase of the clock signal, high or low, or self-timed phases based on the clock signal), or may be one or more clock cycles.

During a first read (including a precharge phase 70 and a read phase 72), the second partition 14B is read; Accordingly, during the precharge phase 70, the Pchg[1] signal is activated (active low in this example), thus activating the precharge transistor similar to transistor 38 and coupled to conductor 34. The precharge transistor precharges the conductor 34 to a Vdd voltage level (illustrated as the BL1[0] signal rising to a binary one during the precharge phase 70). The Pchg[0] and Pchg[2] signals are deactivated during the precharge phase 70, and thus the corresponding bitline conductors are not precharged. Additionally, during the precharge phase 70, the Pdwn[1] signal is deactivated (active high in this example) to ensure that the transistor similar to transistor 42 and coupled to the conductor 34 is not activated during the read phase 72. The Pdwn[0] and Pdwn[2] signals are activated, thus holding the bitline conductors for the partitions 14A and 14C to a ground voltage (illustrated as the BL0[0] and BL2[0] signals lowering to a binary zero during the precharge phase 70). Responsive to the binary one on the BL1[0] signal, the output signal Out[0] switches to a binary one during the precharge phase 70. At the end of the precharge phase, the Pchg[1] signal deactivates to allow evaluation of the location in the read phase 72. However the Pdwn[0] and Pdwn[2] signals remain active during the read phase 72 to hold the BL0[0] and BL2[0] signals at a binary zero.

During the read phase 72, the wordline signal WL[0] is activated (active high in this example). The transistor 30C in partition 14B is not connected to the bitline conductor 34, and thus the BL1[0] signal remains at a binary one. Therefore, the output signal Out[0] also remains at a binary one, and a binary one is read from the ROM 10.

During a second read (including a precharge phase 74 and a read phase 76), the first partition 14A is read. Accordingly, during the precharge phase 74, the Pchg[0] signal is activated, thus activating the transistor 38. The transistor 38 precharges the conductor 32 to a Vdd voltage level (illustrated as the BL0[0] signal rising to a binary one during the precharge phase 74). The Pchg[1] and Pchg[2] signals are deactivated during the precharge phase 74, and thus the corresponding bitline conductors are not precharged. Additionally, during, the precharge phase 74, the Pdwn[0] signal is deactivated to ensure that the transistor 42 is not activated during the read phase 76. The Pdwn[1] and Pdwn[2] signals are activated, thus holding the bitline conductors for the partitions 14B and 14C to a ground voltage (illustrated as the BL1[0] and BL2[0] signals lowering to a binary zero during the precharge phase 74). Responsive to the binary one on the BL0[0] signal, the output signal Out[0] remains at a binary one during the precharge phase 74. At the end of the precharge phase, the Pchg[0] signal deactivates to allow evaluation of the location in the read phase 76. However the Pdwn[1] and Pdwn[2] signals remain active during the read phase 76 to hold the BL1[0] and BL2[0] signals at a binary zero.

During the read phase 76, the wordline signal WL[0] is activated. The transistor 30A in partition 14A is connected to the bitline conductor 32, and thus the BL0[0] signal switches to a binary zero during the read phase 76. In response, the output signal Out[0] switches to a binary zero, and a binary zero is read from the ROM 10.

It is noted that, while the Pdwn[2:0] signals are shown active (for the non-read partitions) during both the precharge phase and read phase of a read, these signals may be active during only the read phase, if desired.

Figure 6:
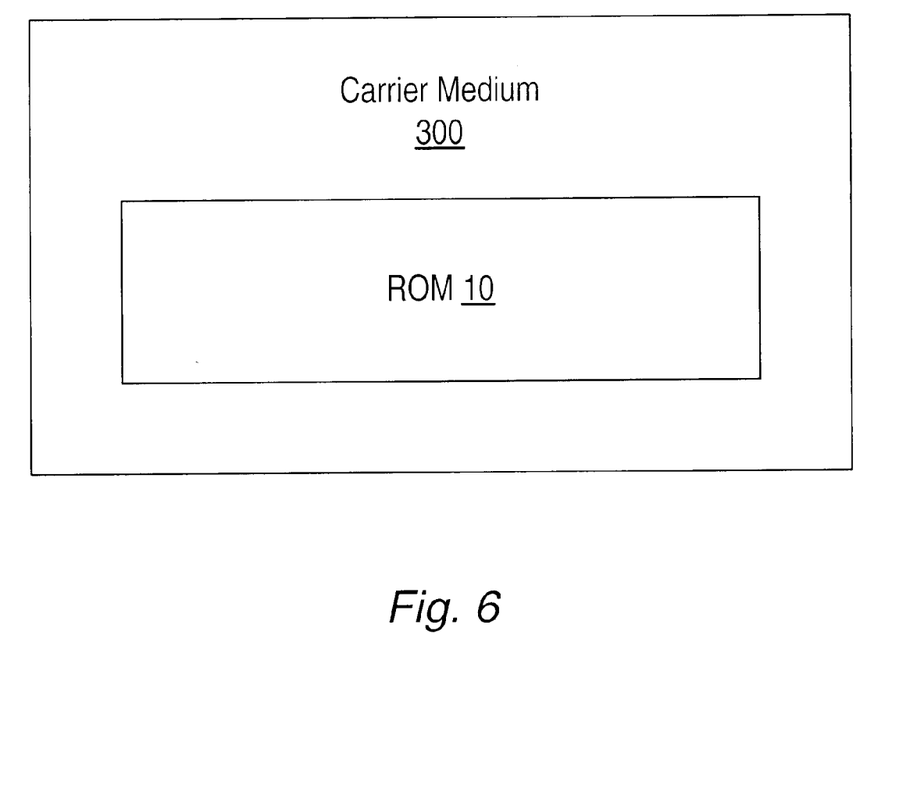
FIG. 6 is a block diagram of a carrier medium.

Turning now to FIG. 6, a block diagram of a carrier medium 300 including a database representative of the ROM 10 is shown. Generally speaking, a carrier medium may include storage media such as magnetic or optical media, e.g., disk or CD-ROM, volatile or non-volatile memory media such as RAM (e.g. SDRAM, RDRAM, SRAM, etc.), ROM, etc., as well as transmission media or signals such as electrical, electromagnetic, or digital signals, conveyed via a communication medium such as a network and/or a wireless link.

Generally, the database of the ROM 10 carried on carrier medium 300 may be a database which can be read by a program and used, directly or indirectly, to fabricate the hardware comprising the ROM 10. For example, the database may be a behavioral-level description or register-transfer level (RTL) description of the hardware functionality in a high level design language (HDL) such as Verilog or VHDL. The description may be read by a synthesis tool which may synthesize the description to produce a netlist comprising a list of gates from a synthesis library. The netlist comprises a set of gates which also represent the functionality of the hardware comprising the ROM 10. The netlist may then be placed and routed to produce a data set describing geometric shapes to be applied to masks. The masks may then be used in various semiconductor fabrication steps to produce a semiconductor circuit or circuits corresponding to the ROM 10. Alternatively, the database on carrier medium 300 may be the netlist (with or without the synthesis library) or the data set, as desired.

While carrier medium 300 carries a representation of the ROM 10, other embodiments may carry a representation of any portion of ROM 10, as desired, including any ROM arrays, partitions of the ROM arrays, bitline precharge circuits, partition selector circuits, output circuits, address decoders, etc.

Numerous variations and modifications will become apparent to those skilled in the art once the above disclosure is fully appreciated. It is intended that the following claims be interpreted to embrace all such variations and modifications.

What is claimed is:

1. An apparatus comprising:
  a first partition of a plurality of partitions of a memory array, the first partition coupled to at least a first conductor and configured to output a first signal on the first conductor;

a circuit coupled to the first conductor and coupled to receive an input indicative of whether or not the first partition is selected for a read, wherein the circuit is configured to precharge the first conductor to a first voltage responsive to the input indicating that the first partition is selected, and wherein the circuit is configured to actively maintain a second voltage on the first conductor responsive to the input indicating that the first partition is not selected.

2. The apparatus as recited in claim 1 further comprising a second partition of the plurality of partitions, the second partition coupled to at least a second conductor and configured to output a second signal on the second conductor, wherein the circuit is coupled to the second conductor and is configured to actively maintain the second voltage on the second conductor responsive to the input indicating that the first partition is selected.

3. The apparatus as recited in claim 2 further comprising an output circuit coupled to the first conductor and to the second conductor and configured to provide an output of the memory, wherein the output circuit comprises a logic circuit configured to logically combine the first signal on the first conductor and the second signal on the second conductor to produce a first output signal of the output.

4. The apparatus as recited in claim 3 wherein the logic circuit is configured to perform an OR function.

5. The apparatus as recited in claim 3 wherein the logic circuit is configured to perform an AND function.

6. The apparatus as recited in claim 2 wherein the circuit is configured to precharge the second conductor to the first voltage responsive to the input indicating that the second partition is selected.

7. The apparatus as recited in claim 1 wherein the memory array is a read-only memory (ROM).

8. The apparatus as recited in claim 1 wherein the first signal represents a bit read from the first partition.

9. The apparatus as recited in claim 1 further comprising a partition selector circuit coupled to the circuit, wherein the partition selector circuit is configured to generate the input to the circuit responsive to an attribute of the read other than an address corresponding to the read.

10. The apparatus as recited in claim 9 further comprising an address decoder coupled to the first partition and further coupled to receive the address corresponding to the read, and wherein the address decoder is configured to decode the address into a plurality of wordline signals provided by the address decoder to the first partition.

11. The apparatus as recited in claim 10 wherein the address decoder is further configured to provide the plurality of wordline signals to each of the plurality of partitions.

12. The apparatus as recited in claim 1 wherein the input comprises a first input signal indicative of whether or not the first partition is selected for the read and a second input signal indicative of whether or not the first partition is selected for the read, wherein the circuit is configured to precharge the first conductor responsive to activation of the first input signal, and wherein the circuit is configured to actively maintain the second voltage on the first conductor responsive to activation of the second input signal.

13. The apparatus as recited in claim 12 wherein the memory array operates according to a precharge phase and a read phase, and wherein the first input signal is activated during the precharge phase if the first partition is selected and is deactivated during the read phase.

14. The apparatus as recited in claim 13 wherein the second input signal is activated during the precharge phase and the read phase if the first partition is not selected.

15. A method comprising:

selecting one of a plurality of partitions of a memory array for a read, wherein a first partition of the plurality of partitions is coupled to a first conductor and is configured to output a first signal on the first conductor;

precharging the first conductor to a first voltage responsive to selecting the first partition for the read; and actively maintaining a second voltage on the first conductor responsive to selecting a different partition than the first partition for the read.

16. The method as recited in claim 15 further comprising actively maintaining the second voltage on a second conductor to which a second partition of the plurality of partitions is coupled responsive to the input indicating that the first partition is selected.

17. The method as recited in claim 15 wherein the selecting is responsive to an attribute of the read other than an address corresponding to the read.

18. A carrier medium comprising a database read by a program during a process of fabricating an integrated circuit, the database representing:

a first partition of a plurality of partitions of a memory array, the first partition coupled to at least a first conductor and configured to output a first signal on the first conductor;

a circuit coupled to the first conductor and coupled to receive an input indicative of whether or not the first partition is selected for a read, wherein the circuit is configured to precharge the first conductor to a first voltage responsive to the input indicating that the first partition is selected, and wherein the circuit is configured to actively maintain a second voltage on the first conductor responsive to the input indicating that the first partition is not selected.

19. The carrier medium as recited in claim 18 wherein the database further represents a second partition of the plurality of partitions, the second partition coupled to at least a second conductor and configured to output a second signal on the second conductor, wherein the circuit is coupled to the second conductor and is configured to actively maintain the second voltage on the second conductor responsive to the input indicating that the first partition is selected.

20. The carrier medium as recited in claim 19 wherein the input comprises a first input signal indicative of whether or not the first partition is selected for the read and a second input signal indicative of whether or not the first partition is selected for the read, wherein the circuit is configured to precharge the first conductor responsive to activation of the first input signal, and wherein the circuit is configured to actively maintain the second voltage on the first conductor responsive to activation of the second input signal.

21. The carrier medium as recited in claim 20 wherein the memory array operates according to a precharge phase and a read phase, and wherein the first input signal is activated during the precharge phase if the first partition is selected and is deactivated during the read phase.

22. The carrier medium as recited in ciaim 21 wherein the second input signal is activated during the precharge phase and the read phase if the first partition is not selected.

* * * * *